United States Patent
Jiang et al.

(10) Patent No.: US 9,479,043 B2
(45) Date of Patent: Oct. 25, 2016

(54) CONTROL CIRCUIT WITH SYNCHRONIZATION UNIT FOR SWITCHING CONVERTER AND ASSOCIATED CONTROL METHOD

(71) Applicant: Chengdu Monolithic Power Systems Co., Ltd., Chengdu (CN)

(72) Inventors: Lijie Jiang, Hangzhou (CN); Xiaokang Wu, Hangzhou (CN); Suhua Luo, Hangzhou (CN); Qian Ouyang, Hangzhou (CN)

(73) Assignee: CHENGDU MONOLITHIC POWER SYSTEMS CO., LTD., Chengdu (CN)

( * ) Notice: Subject to any disclaimer, the term of this patent is extended or adjusted under 35 U.S.C. 154(b) by 74 days.

(21) Appl. No.: 14/625,319

(22) Filed: Feb. 18, 2015

(65) Prior Publication Data
US 2015/0236580 A1    Aug. 20, 2015

(30) Foreign Application Priority Data
Feb. 18, 2014    (CN) .......................... 2014 1 0054250

(51) Int. Cl.
| | |
|---|---|
| *H02M 1/12* | (2006.01) |
| *H02M 1/14* | (2006.01) |
| *H02M 1/084* | (2006.01) |
| *H03L 7/081* | (2006.01) |
| *H03L 7/097* | (2006.01) |
| *H02M 3/158* | (2006.01) |

(52) U.S. Cl.
CPC ......... *H02M 1/0845* (2013.01); *H02M 3/1584* (2013.01); *H03L 7/0814* (2013.01); *H03L 7/097* (2013.01)

(58) Field of Classification Search
USPC ............................ 363/98, 21.12, 41; 323/282
See application file for complete search history.

(56) References Cited

U.S. PATENT DOCUMENTS

| | | | |
|---|---|---|---|
| 7,336,056 B1* | 2/2008 | Dening ................. | H02M 3/157 323/222 |
| 8,717,002 B2 | 5/2014 | Xi | |
| 8,896,278 B2 | 11/2014 | Ouyang et al. | |
| 8,922,177 B2 | 12/2014 | Ren et al. | |
| 2002/0140410 A1* | 10/2002 | Rothleitner ......... | H02M 3/1582 323/282 |
| 2013/0154598 A1* | 6/2013 | Yu ........................... | G05F 1/618 323/285 |
| 2013/0162233 A1* | 6/2013 | Marty ................... | H02M 3/158 323/274 |
| 2013/0307498 A1 | 11/2013 | Jiang et al. | |
| 2013/0342176 A1 | 12/2013 | Yang et al. | |
| 2014/0022684 A1 | 1/2014 | Jiang et al. | |
| 2014/0184180 A1* | 7/2014 | Kronmueller ........... | G05F 1/595 323/271 |
| 2016/0118893 A1* | 4/2016 | Doyle ................... | H02M 3/158 323/271 |
| 2016/0126841 A1* | 5/2016 | Sandrez ............... | H02H 7/1213 323/271 |

* cited by examiner

Primary Examiner — Adam Houston

(57) ABSTRACT

A control circuit for a switching converter having a comparison circuit, a synchronization unit, an ON-time control circuit and a logic unit, the comparison circuit provides a comparison signal based on a reference signal and an output signal of the switching converter, the synchronization unit provides a first synchronization signal and a second synchronization signal based on a first clock signal, a second clock signal and the comparison signal, the first synchronizing signal is generated by synchronizing the comparison signal with the first clock signal, the second synchronizing signal is generated by synchronizing the comparison signal with the second clock signal, the ON-time control circuit provides an ON-time control signal, the logic unit provides a switching control signal to control the switching converter based on the first synchronization signal, the second synchronization signal and the ON-time control signal.

20 Claims, 8 Drawing Sheets

CONTROL CIRCUIT WITH SYNCHRONIZATION UNIT FOR SWITCHING CONVERTER AND ASSOCIATED CONTROL METHOD

CROSS-REFERENCE TO RELATED APPLICATION(S)

This application claims the benefit of CN application No. 201410054250.3, filed on Feb. 18, 2014, and incorporated herein by reference.

TECHNICAL FIELD

The present invention relates to electrical circuit, more particularly but not exclusively relates to switching converter.

BACKGROUND

Constant ON-time control is widely used in switching converter per fast transient response, simple circuit structure and smooth mode transition. A constant ON-time control circuit for controlling a switching converter usually provides a comparison signal by comparing an output signal of the switching converter with a reference signal, and provides a switching control signal to control the switching converter based on the comparison signal. For example, when the output signal is less than the reference signal, the comparison signal becomes high voltage level and the switching control signal is configured to turn ON the switching converter.

Generally, the constant ON-time control circuit comprises a sequential logic circuit configured to receive the comparison signal and generate the switching control signal. However, the sequential logic circuit introduces metastability. In order to improve stability and insure a fast transient response meanwhile, the constant ON-time control circuit needs to be improved.

SUMMARY

It is one of the objects of the present invention to provide a control circuit for a switching converter to resolve one or more of the above technical problems.

One embodiment of the present invention discloses a control circuit for a switching converter, the switching converter having a switch and an output terminal configured to provide an output signal, and the control circuit comprising: a comparison circuit, configured to provide a comparison signal based on a reference signal and the output signal of the switching converter; a synchronization unit, configured to receive a first clock signal, a second clock signal and the comparison signal, and configured to provide a first synchronization signal and a second synchronization signal, wherein the first synchronization signal is generated by synchronizing the comparison signal with the first clock signal, and the second synchronization signal is generated by synchronizing the comparison signal with the second clock signal; an ON-time control circuit, configured to provide an ON-time control signal to control an ON-time period of the switch; and a logic unit, configured to receive the first synchronization signal, the second synchronization signal and the ON-time control signal, and configured to provide a switching control signal based on the first synchronization signal, the second synchronization signal and the ON-time control signal to control the switch, wherein the switch is turned ON based on the first synchronization signal and the second synchronization signal, and the switch is turned OFF based on the ON-time control signal.

Another embodiment of the present invention discloses a control circuit for a multi-phase switching converter, wherein the multi-phase switching converter having a plurality of switching circuits and an output terminal configured to provide an output signal, and the control circuit comprising: a comparison circuit, configured to provide a comparison signal based on a reference signal and the output signal of the multi-phase switching converter; a synchronization unit, configured to receive a clock signal and the comparison signal, and configured to provide a first synchronization signal and a second synchronization signal based on the clock signal and the comparison signal, wherein the first synchronization signal is generated by synchronizing the comparison signal with a rising edge of the clock signal, and the second synchronization signal is generated by synchronizing the comparison signal with a falling edge of the clock signal; an ON-time control circuit, configured to provide an ON-time control signal to control an ON-time period of each switching circuit; a logic unit, configured to provide a plurality of switching control signals based on the first synchronization signal, the second synchronization signal and the ON-time control signal to control the plurality of switching circuits.

Yet another embodiment of the present invention discloses a method for controlling a multi-phase switching converter, wherein the multi-phase switching converter having a plurality of switching circuits and an output terminal configured to provide an output signal, and the method comprising: providing a comparison signal based on a reference signal and the output signal; providing a first synchronization signal based on the comparison signal and a first clock signal; providing a second synchronization signal based on the comparison signal and a second clock signal; providing an ON-time control signal to control an ON-time period of each of the plurality of switching circuits; and providing a plurality of switching control signals based on the first synchronization signal, the second synchronization signal and the ON-time control signal to control the plurality of switching circuits; wherein when the second synchronization signal is in a first state, the first synchronization signal is generated by synchronizing the comparison signal with a first clock signal; and wherein when the first synchronization signal is in a first state, the second synchronization is generated by synchronizing the comparison signal with a second clock signal.

In one embodiment, a comparison signal is synchronized respectively by two clock signals to ensure a short delay time interval between the comparison signal and a switching control signal, as a result, the system stability is improved with good transient response performance.

BRIEF DESCRIPTION OF THE DRAWINGS

Non-limiting and non-exhaustive embodiments are described with reference to the following drawings.

The use of the same reference label in different drawings indicates the same or like components.

DETAILED DESCRIPTION

In the present application, numerous specific details are provided, such as examples of circuits, components, and methods, to provide a thorough understanding of embodiments of the invention. These embodiments are exemplary, not to confine the scope of the invention. Persons of ordinary skill in the art will recognize, however, that the invention can be practiced without one or more of the specific details. In other instances, well-known details are not shown or described to avoid obscuring aspects of the invention. Some phrases are used in some exemplary embodiments. However, the usage of these phrases is not confined to these embodiments.

Several embodiments of the present invention are described below with reference to switching converter, control circuit and associated control method. As used hereinafter, the term "couple" generally refers to multiple ways including a direct connection with an electrical conductor and an indirect connection through intermediate diodes, resistors, capacitors, and/or other intermediaries.

Figure 1:
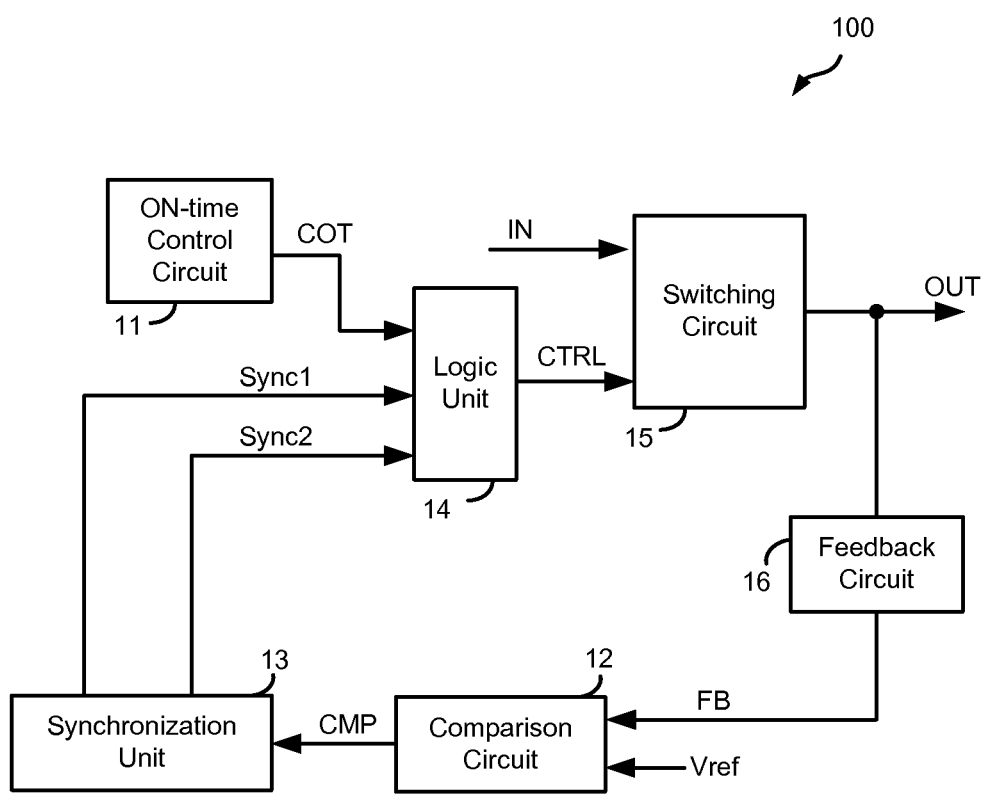
FIG. 1 illustrates a switching converter 100 according to an embodiment of the present invention.

FIG. 1 illustrates a switching converter 100 according to an embodiment of the present invention. Switching converter 100 comprises a control circuit, a switching circuit 15 and a feedback circuit 16. Switching circuit 15 comprises a switch, switching circuit 15 is configured to receive an input signal IN and provide an output signal OUT through turning ON and turning OFF the switch. The switch in switching circuit 15 may be any controllable semiconductor switching device, such as Metal Oxide Semiconductor Field Effect Transistor (MOSFET), Insulated Gate Bipolar Transistor (IGBT) and so on. Input signal IN and output signal OUT may be a voltage signal, a current signal or a power signal. Switching circuit 15 may adopt any suitable DC/DC or AC/DC topology, such as step-up converter, step-down converter, flyback converter, and so on. Feedback circuit 16 is coupled to an output terminal of switching converter 15, and provides a feedback signal FB representing output signal OUT. Feedback circuit 16 may comprises a resistor divider or a capacitor divider.

The control circuit comprises an ON-time control circuit 11, a comparison circuit 12, a synchronization unit 13 and a logic unit 14. ON-time control circuit 11 is configured to provide an ON-time control signal COT to control an ON-time period of the switch in switching circuit 15. Comparison circuit 12 is coupled to feedback circuit 16 to receive feedback signal FB and is configured to provide comparison signal CMP by comparing feedback signal FB with a reference signal Vref. Synchronization unit 13 is coupled to comparison circuit 12 to receive comparison signal CMP and is configured to provide a synchronization signal Sync1 and a synchronization signal Sync2 based on comparison signal CMP. In one embodiment, synchronization unit 13 is configured to provide synchronization signal Sync1 by synchronizing comparison signal CMP with a first clock domain, and provide synchronization signal Sync2 by synchronizing comparison signal CMP with a second clock domain. For example, generating synchronization signal Sync1 by sampling comparison signal CMP at a rising edge of a clock signal, and generating synchronization signal Sync2 by sampling comparison signal CMP at a falling edge of the clock signal, where the first clock domain corresponding to the rising edge of the clock signal, and the second clock domain corresponding to the falling edge of the clock signal. Logic unit 14 is coupled to ON-time control circuit 11 to receive ON-time control signal COT and is coupled to synchronization unit 13 to receive synchronization signal Syn1 and synchronization signal Sync2, and is configured to provide a switching control signal CTRL to control switching circuit 15 based on ON-time control signal COT, synchronization signal Sync1 and synchronization signal Sync2.

Figure 2:
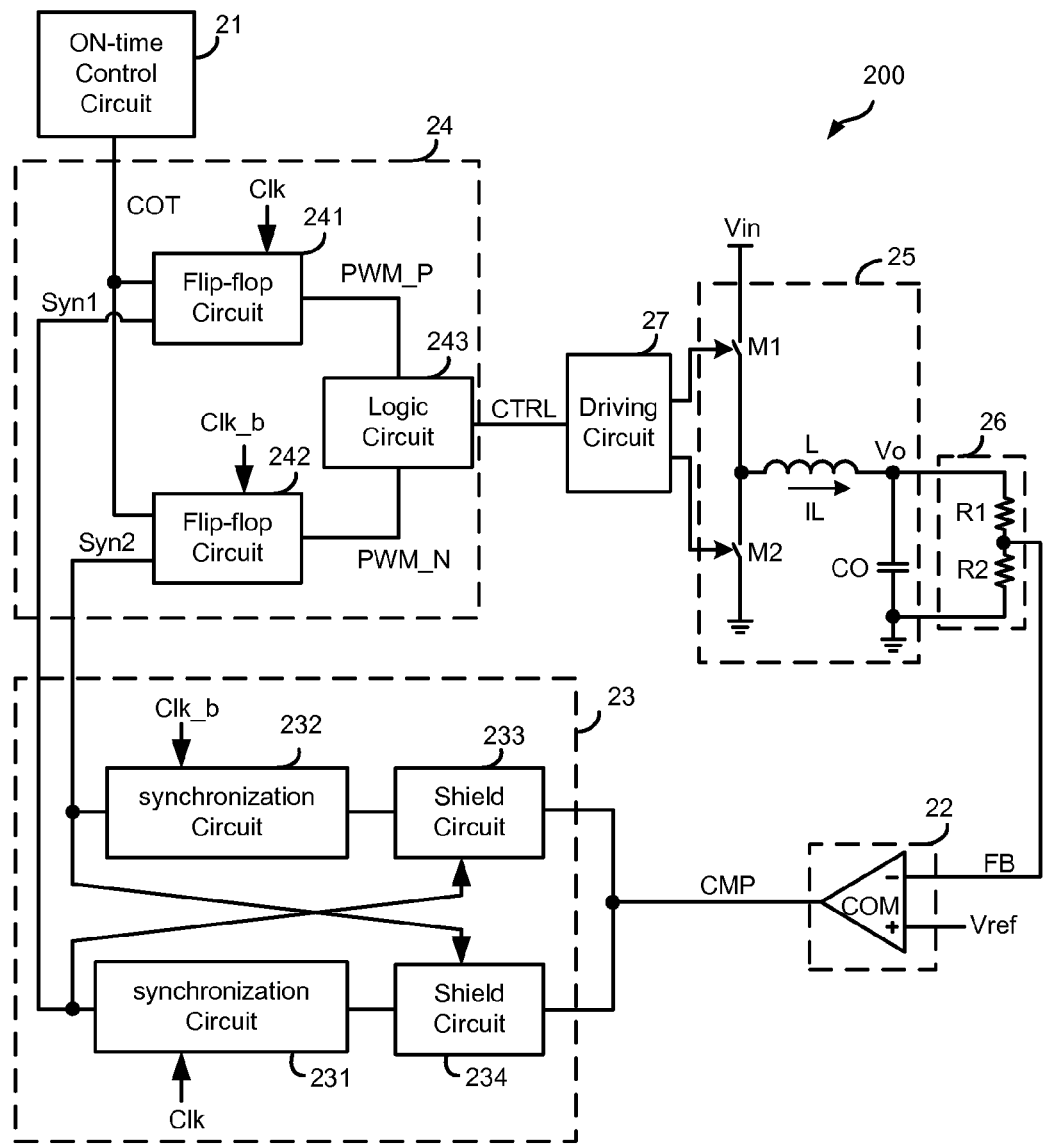
FIG. 2 schematically illustrates a switching converter 200 according to an embodiment of the present invention.

FIG. 2 schematically illustrates a switching converter 200 according to an embodiment of the present invention. A switching circuit 25 comprises a switch M1, a switch M2, an inductor L1 and an output capacitor CO. Switching circuit 25 is configured to receive an input voltage Vin and provide an output voltage Vo through turning ON and turning OFF switch M1 and switch M2. Switch M1 has a first terminal coupled to an input terminal of switching circuit 25 to receive input voltage Vin, a second terminal and a control terminal. Switch M2 has a first terminal coupled to the second terminal of switch M1, a second terminal coupled to a system ground, and a control terminal. Inductor L1 has a first terminal coupled to the second terminal of switch M1 and the first terminal of switch M2. Output capacitor CO is coupled between the second terminal of inductor L1 and the system ground. A voltage across output capacitor CO is output voltage Vo. In one embodiment, switch M2 may be replaced by a diode. A feedback circuit 26 is coupled to an output terminal of switching circuit 25 to receive output voltage Vo, and provides feedback signal FB representing output voltage Vo. In one embodiment, feedback circuit 26 comprises a resistor divider comprising a resistor R1 and a resistor R2.

A comparison circuit 22 comprises a comparator COM. Comparator COM has a non-inverting terminal configured to receive reference signal Vref, an inverting terminal coupled to feedback circuit 26 to receive feedback signal FB, and an output terminal configured to provide a comparison signal CMP by comparing feedback signal FB with reference signal Vref. In one embodiment, when feedback signal FB is less than reference signal Vref, comparison signal CMP becomes high voltage level.

A synchronization unit 23 comprises a synchronization circuit 231 and a synchronization circuit 232. Synchronization circuit 231 is configured to provide synchronization signal Sync1 based on comparison signal CMP and a clock signal Clk. In one embodiment, synchronization signal Sync1 is generated by synchronizing comparison signal CMP with a rising edge of clock signal Clk. Synchronization circuit 232 is configured to provide synchronization signal Sync2 based on comparison signal CMP and a clock signal Clk_b. In one embodiment, synchronization signal Sync2 is generated by synchronizing comparison signal CMP with a rising edge of clock signal Clk_b. In one embodiment, clock signal Clk and clock signal Clk_b are out of phase, i.e., clock signal Clk and clock signal Clk_b have a reversed phase position. Clock signal Clk may be a system clock and clock signal Clk_b may be generated from clock signal Clk.

An ON-time control circuit 21 is configured to provide ON-time control signal COT to control an ON-time period of switch M1. A logic unit 24 is coupled to ON-time control circuit 21 to receive ON-time control signal COT and coupled to synchronization unit 23 to receive synchronization signal Sync1 and synchronization signal Sync2, and is configured to provide switching control signal CTRL based on ON-time control signal COT, synchronization signal Sync1 and synchronization signal Sync2. Logic unit 24 comprises a flip-flop circuit 241, a flip-flop circuit 242 and a logic circuit 243. Flip-flop circuit 241 is coupled to synchronization circuit 231 to receive synchronization signal Sync1, coupled to ON-time control circuit 21 to receive ON-time control signal COT, and is configured to provide a pulse signal PWM_P based on synchronization signal Sync1 and ON-time control signal COT. In one embodiment, flip-flop circuit 241 is set by synchronization signal Sync1, and flip-flop circuit 241 is reset by ON-time control signal COT. In one embodiment, flip-flop circuit 241 is a synchronous sequential circuit to receive clock signal Clk, and flip-flop circuit 241 is set by synchronization signal Sync1 at the rising edge of clock signal Clk. Flip-flop circuit 242 is coupled to synchronization circuit 232 to receive synchronization signal Sync2, coupled to ON-time control circuit 21 to receive ON-time control signal COT, and is configured to provide a pulse signal PWM_N based on synchronization signal Sync2 and ON-time control signal COT. In one embodiment, flip-flop circuit 242 is set by synchronization signal Sync2, and flip-flop circuit 242 is reset by ON-time control signal COT. In one embodiment, flip-flop circuit 242 is a synchronous sequential circuit to receive clock signal Clk_b, and flip-flop circuit 242 is set by synchronization signal Sync2 at the rising edge of clock signal Clk_b. One of ordinary skill in the art should also understand that flip-flop circuit 241 and flip-flop circuit 242 may comprise synchronous RS flip-flop, asynchronous RS flip-flop, D flip-flop, JK flip-flop and any other suitable flip-flop. Logic circuit 243 is coupled to flip-flop circuit 241 and flip-flop circuit 242, and is configured to provide switching control signal CTRL based on pulse signal PWM_P and pulse signal PWM_N. In one embodiment, logic circuit 243 is configured to provide switching control signal CTRL according to one of pulse signal PWM_P and pulse signal PWM_N. in one embodiment, logic circuit comprises an OR gate. By introducing synchronization circuits 231 and 232, comparison signal CMP is synchronized within half of the system clock, the system stability is improved with good transient performance per a short delay time interval caused by synchronizing.

A shield circuit 233 is employed to stop transferring comparison signal CMP to synchronization circuit 232 when synchronization signal Sync1 is effective to set flip-flop circuit 241, and a shield circuit 234 is employed to stop transferring comparison signal CMP to synchronization circuit 231 when synchronization signal Sync2 is effective to set flip-flop circuit 242. As shown in FIG. 2, synchronization circuit 232 is coupled to the output terminal of comparator COM through shield circuit 233. Shield circuit 233 is coupled to the output terminal of comparator COM to receive comparison signal CMP, and is coupled to synchronization circuit 231 to receive synchronization signal Sync1. When synchronization signal Sync1 is effective, for example high voltage level, comparison signal CMP is shielded and will not be transferred to synchronization circuit 232, synchronization signal Sync2 maintains. Synchronization circuit 231 is coupled to the output terminal of comparator COM through shield circuit 234. Shield circuit 234 is coupled to the output terminal of comparator COM to receive comparison signal CMP, and is coupled to synchronization circuit 232 to receive synchronization signal Sync2. When synchronization signal Sync2 is effective, for example high voltage level, comparison signal CMP is shielded and will not be transferred to synchronization circuit 231, synchronization signal Sync1 maintains.

As show in FIG. 2, switching converter 200 further comprises a driving circuit 27. Driving circuit 27 is coupled to logic unit 24 to receive switching control signal CTRL and provides driving signals to drive switch M1 and switch M2.

Figure 3:
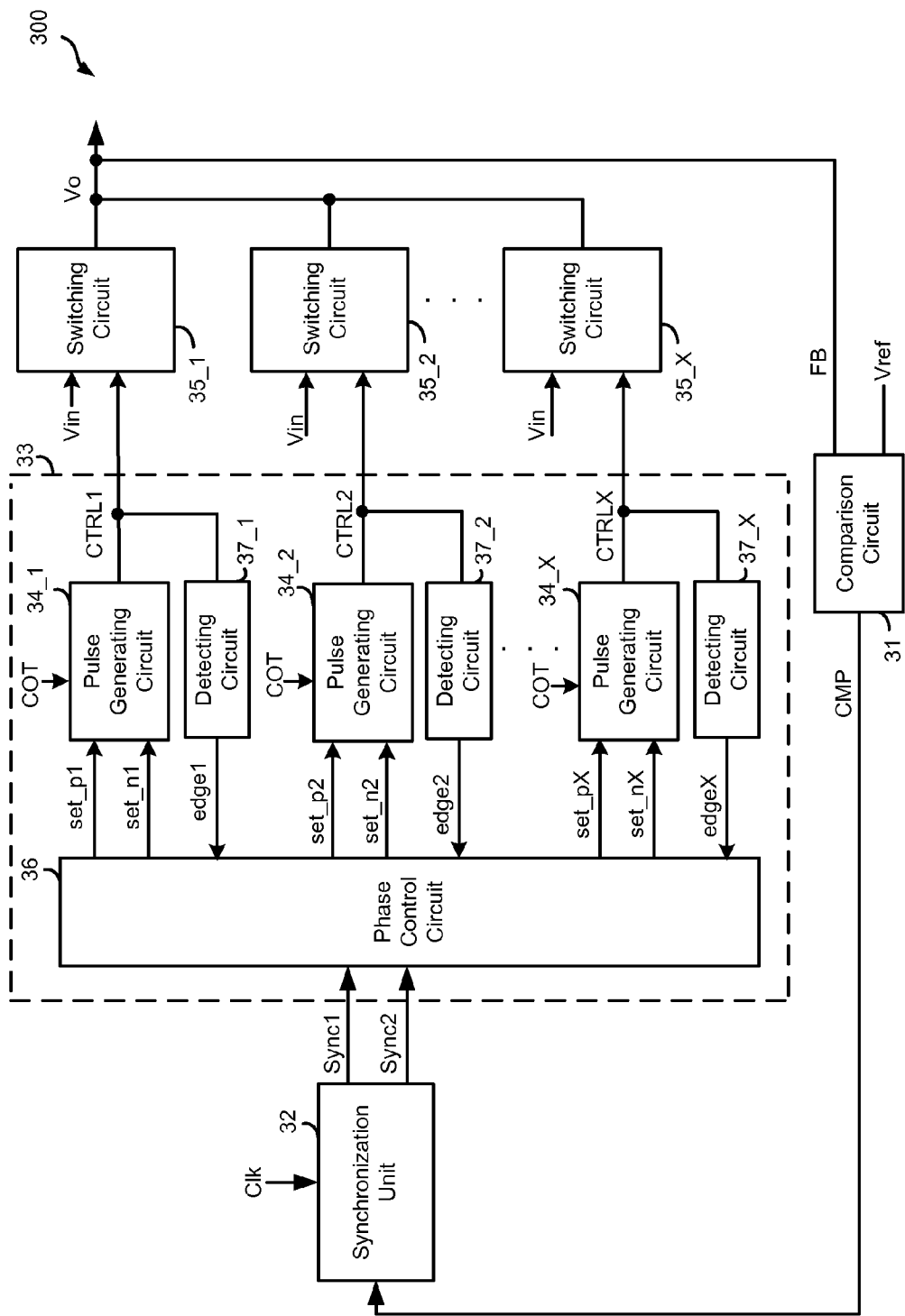
FIG. 3 schematically illustrates a multi-phase switching converter 300 according to an embodiment of the present invention.

FIG. 3 schematically illustrates a multi-phase switching converter 300 according to an embodiment of the present invention. Multi-phase switching converter 300 comprises a control circuit and switching circuits 35_1-35_X, where X is an integer larger than 1. Each switching circuit is configured to receive input voltage Vin, and provide output voltage Vo. Each switching circuit may adopt any suitable topology of DC/DC converter or AC/DC converter, for example, step-up converter, step-down converter, flyback converter, and so on.

Figure 6:
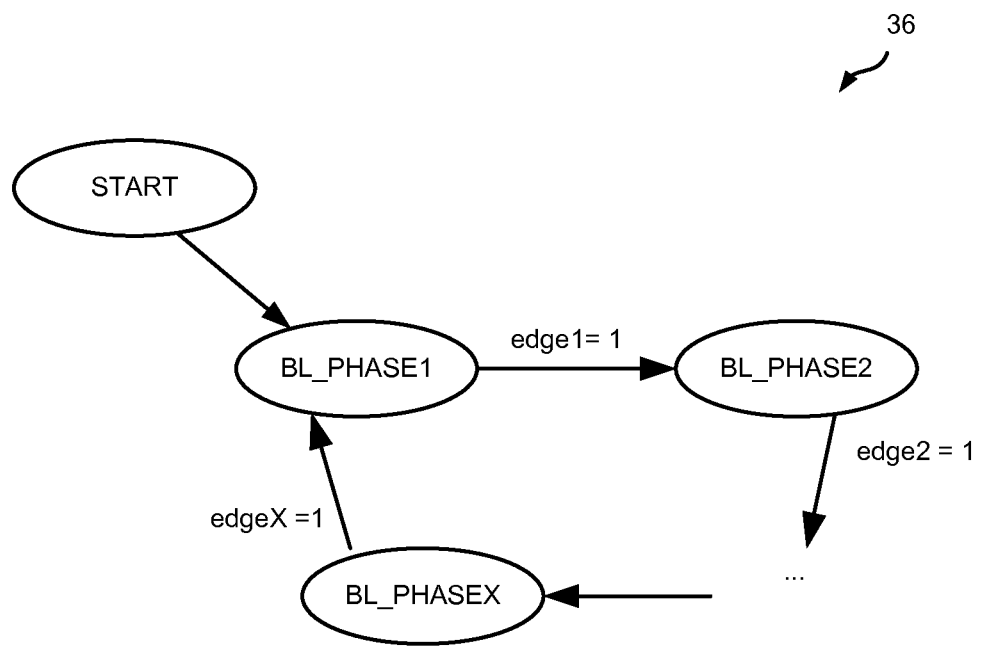
FIG. 6 shows a state diagram of phase control circuit 36 according to an embodiment of the present invention.

The control circuit comprises a comparison circuit 31, a synchronization unit 32 and logic unit 33. The control circuit is configured to provide switching control signals CTRL1-CTRLX to switching circuits 35_1-35_X. Synchronization unit 32 is similar to synchronization unit 23, and comparison circuit 31 is similar to comparison circuit 22. Comparison circuit 31 is configured to receive output voltage Vo, and is configured to provide comparison signal CMP based on reference signal Vref and output voltage Vo. In one embodiment, synchronization unit 32 is coupled to comparison circuit 31 to receive comparison signal CMP, and is configured to provide synchronization signal Sync1 by synchronizing comparison signal CMP with the rising edge of clock signal Clk, and provide synchronization signal Sync2 by synchronizing comparison signal CMP with the falling edge of clock signal Clk. Logic unit 33 is configured to provide switching control signals CTRL1-CTRLX based on synchronization signal Sync1, synchronization signal Sync2, and ON-time control signal COT. Logic unit 33 comprises a phase control circuit 36 and pulse generating circuits 34_1-34_X. Phase control circuit 36 is configured to provide set signals set_p1-set_pX based on synchronization signal Sync1 and detecting signals edge1-edgeX, and provide set signals set_n1-set_nX based on synchronization signal Sync2 and detecting signals edge1-edgeX. In one embodiment, each detecting signal is employed to indicate if corresponding switching control signal is effective to turn ON corresponding switching circuit. For example, when detecting signal edge1 indicates that switching control signal CTRL1 is effective to turn ON switching circuit 35_1, phase control circuit 36 is configured to provide set signal set_p2 to control switching circuit 35_2 based on synchronization signal Sync1, and provide set signal set_n2 to control switching circuit 35_2 based on synchronization signal Sync2. When detecting signal edge2 indicates that switching control signal CTRL2 is effective to turn ON switching circuit 35_2, phase control circuit 36 is configured to provide set signal set_p2 to control a next switching circuit based on synchronization signal Sync1, and provide set signal set_n2 to control the next switching circuit based on synchronization signal Sync2. When detecting signal edgeX indicates that switching control signal CTRLX is effective to turn ON switching circuit 35_X, phase control circuit 36 is configured to provide set signal set_p1 to control switching circuit 35_1 based on synchronization signal Sync1, and provide set signal set_n1 to control switching control circuit 35_1 based on synchronization signal Sync2. In one embodiment, phase control circuit 36 comprises a state machine configured to distribute synchronization signal Sync1 as one of set signals set_p1-set_pX and distribute synchronization signal Sync2 as one of set signals set_n1-set_nX. FIG. 6 shows one example of a state diagram of phase control circuit 36. Pulse generating circuits 34_1-34_X are coupled to phase control circuit 36 to receive corresponding set signals set_p1-set_pX and set signals set_n1-set_nX, and are configured to provide switching control signals CTRL1-CTRLX.

In one embodiment, logic unit 33 further comprises detecting circuits 37_1-37_X. Detecting circuit 37_1-37_X are configured to provide detecting signals edge1-edgeX based on switching control signals CTRL1-CTRLX. In one embodiment, when a rising edge of a switching control signal CTRLi is detected, corresponding detecting circuit 37_i is configured to provide an effective detecting signal edgei to indicate that switching circuit 35_i is turned ON, where i is an integer greater than or equal to 1 and less than or equal to X.

Figure 4:
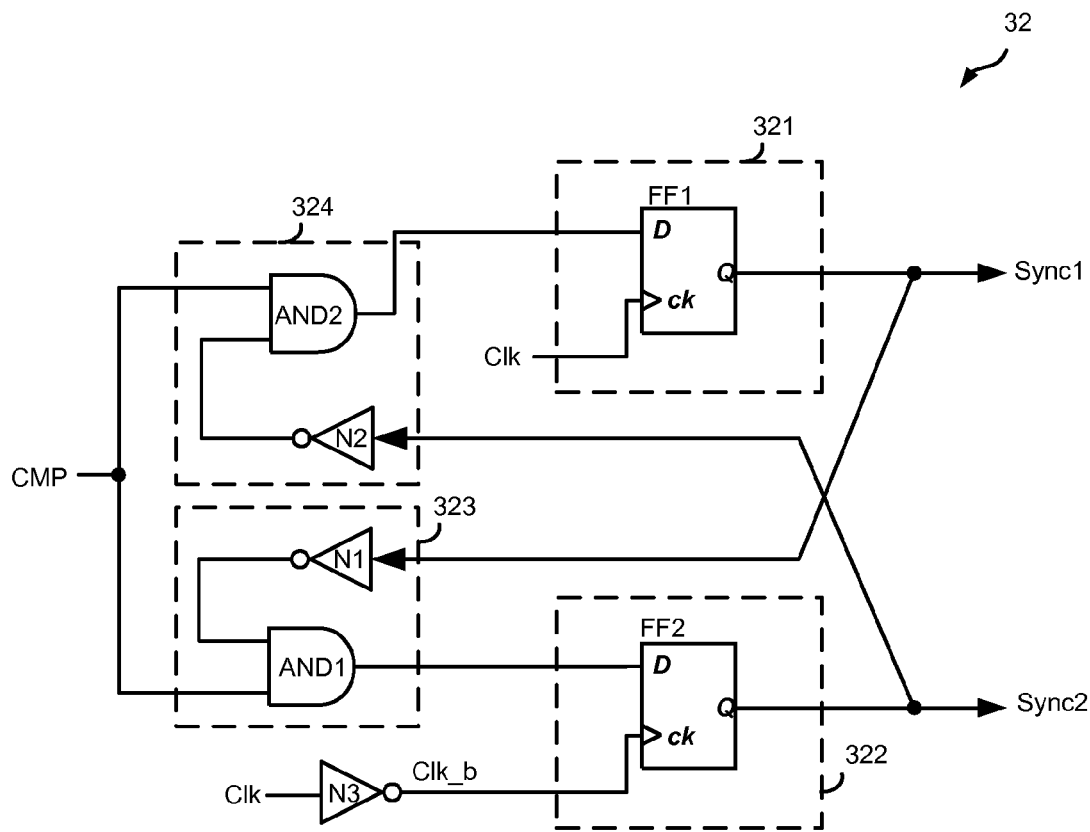
FIG. 4 schematically illustrates a synchronization unit 32 according to an embodiment of the present invention.

FIG. 4 schematically illustrates a synchronization unit 32 according to an embodiment of the present invention. Synchronization unit 32 comprises a synchronization circuit 321, a synchronization circuit 322, a shield circuit 323 and a shield circuit 324. As shown in FIG. 4, synchronization circuit 321 comprises a D flip-flop FF1. Synchronization circuit 321 is configured to provide a synchronization signal Sync1 based on comparison signal CMP, synchronization signal Sync2 and clock signal Clk. D flip-flop FF1 comprises a data input terminal D, a clock terminal ck and an output terminal Q, wherein data input terminal D is coupled to an output terminal of shield circuit 324, clock signal ck is configured to receive clock signal Clk, and output terminal Q is configured to provide synchronization signal Sync1. Synchronization circuit 322 comprises a D flip-flop FF2. Synchronization circuit 322 is configured to provide synchronization signal Sync2 based on comparison signal CMP, synchronization signal Sync1 and clock signal Clk_b. D flip-flop FF2 comprises a data input terminal D, a clock terminal ck, and an output terminal Q, wherein data input terminal D is coupled to an output terminal of shield circuit 323, clock terminal ck is configured to receive clock signal Clk_b, and output terminal Q is configured to provide synchronization signal Sync2. One of ordinary skill in the art should also appreciate that synchronization circuit 321 and synchronization circuit 322 may comprise any other suitable circuit or device to synchronize one signal with a clock signal, for example, a synchronous chain comprising two cascaded D flip-flops. In one embodiment, synchronization unit 32 further comprises an inverter N3 which is configured to receive clock signal Clk and provide clock signal Clk_b based on clock signal Clk.

As shown in FIG. 4, shield circuit 323 comprises a NOT gate N1 and an AND gate AND1. NOT gate N1 is coupled to synchronization circuit 321 to receive synchronization signal Sync1. AND gate AND1 has a first input terminal coupled to an output terminal of NOT gate N1, a second input terminal configured to receive comparison signal CMP, and an output terminal coupled to data input terminal of D flip-flop FF2. When synchronization signal Sync1 is high voltage level, synchronization signal Sync2 maintains and will not change with comparison signal CMP. Shield circuit 324 comprises a NOT gate N2 and an AND gate AND2. NOT gate N2 is coupled to synchronization circuit 322 to receive synchronization signal Sync2. AND gate AND2 has a first input terminal coupled to an output terminal of NOT gate N2, a second input terminal configured to receive comparison signal CMP, and an output terminal coupled to data input terminal of D flip-flop FF1. When synchronization signal Sync2 is high voltage level, synchronization signal Sync1 maintains and will not change with comparison signal CMP.

Figure 5:
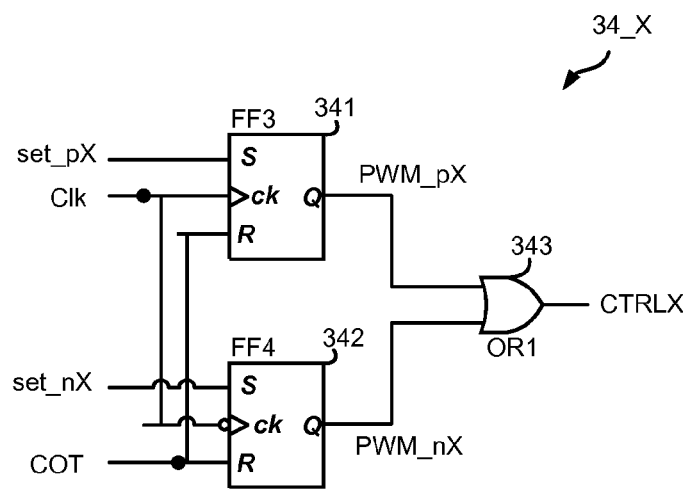
FIG. 5 schematically illustrates a pulse generating circuit 34_X according to an embodiment of the present invention.

FIG. 5 schematically illustrates a pulse generating circuit 34_X according to an embodiment of the present invention. Pulse generating circuit 34_X comprises a flip-flop circuit 341, a flip-flop circuit 342 and a logic circuit 343. Flip-flop circuit 341 comprises a RS flip-flop FF3. RS flip-flip FF3 has a set terminal S configured to receive set signal set_pX, a reset terminal R configured to receive ON-time control signal COT, a clock terminal ck configured to receive clock signal Clk, and an output terminal Q configured to provide pulse signal PWM_pX. In one embodiment, RS flip-flop FF3 is configured as asynchronous set to reduce a delay time interval from comparison signal CMP transiting to high voltage level to corresponding switching circuit is turned ON. RS flip-flop FF3 is set to provide high voltage level pulse signal PWM_pX to turn ON switching circuit 35_X when set signal set_pX is high voltage level. In one embodiment, RS flip-flop FF3 is configured as synchronous reset to insure accuracy of an ON-time period of corresponding switching circuit, and as a result, system stability is improved. At clock signal Clk's rising edge, RS flip-flop FF3 is reset to provide low voltage level pulse signal PWM_pX when ON-time control signal COT is effective to indicate that the ON-time period of corresponding switching circuit equals a predetermined value. Flip-flop circuit 342 comprises a RS flip-flop FF4. RS flip-flop FF4 comprises a set terminal S configured to receive set signal set_nX, a reset terminal R configured to receive ON-time control signal COT, a clock signal ck configured to receive clock signal Clk, and an output terminal Q configured to provide pulse signal PWM_nX. In one embodiment, RS flip-flop FF4 is configured as asynchronous set to reduce the delay time interval from comparison signal CMP transiting to high voltage level to corresponding switching circuit is turned ON. RS flip-flop FF4 is set to provide high voltage level pulse signal PWM_nX when set signal set_nX is effective. In one embodiment, RS flip-flop FF4 is configured as synchronous reset to insure accuracy of the ON-time period of corresponding switching circuit, and as a result, system stability is improved. At clock signal Clk's falling edge, RS flip flop FF4 is reset to provide low voltage level pulse signal PWM_nX when ON-time control signal COT is effective to indicate that the ON-time period of corresponding switching circuit equals the predetermined value. Logic circuit 343 is coupled to RS flip-flop FF3 to receive pulse signal PWM_pX and coupled to RS flip-flop FF4 to receive pulse signal PWM_nX, and is configured to provide switching control signal CTRLX based on pulse signal PWM_pX and pulse signal PWM_nX. In one embodiment, logic circuit 343 is an OR gate OR1. Switching control signal CTRLX becomes high voltage level to turn ON switching circuit 35_X when one of pulse signal PWM_pX and pulse signal PWM_nX becomes high voltage level.

FIG. 6 shows the state diagram of phase control circuit 36 according to an embodiment of the present invention. The state machine of phase control circuit 36 comprises an initial state START and phase control states BL_PHASE1-BL_PHASEX for controlling corresponding switching circuit. Phase control circuit 36 is configured to distribute synchronization signal Sync1 and synchronization signal Sync2 to one of pulse generating circuits 34_1-34_X based on a state of the state machine. For example, when in phase control state BL_PHASE1, phase control circuit 36 is configured to provide set signal set_p1 to pulse generating circuit 34_1 based on synchronization signal Sync1, and provide set signal set_n1 to pulse generating circuit 34_1 based on synchronization signal Sync2, and pulse generating circuit 34_1 is configured to provide switching control signal CTRL1 to switching circuit 35_1 based on set signal set_p1 and set signal set_n1. When in phase control state BL_PHASE2, phase control circuit 36 is configured to provide set signal set_p2 to pulse generating circuit 34_2 based on synchronization signal Sync1, and provide set signal set_n2 to pulse generating circuit 34_2 based on synchronization signal Sync2, and pulse generating circuit 34_2 is configured to provide switching control signal CTRL2 to switching circuit 35_2 based on set signal set_p2 and set signal set_n2. When in phase control state BL_PHASEX, phase control circuit 36 is configured to provide set signal set_pX to pulse generating circuit 34_X based on synchronization signal Sync1, and provide set signal set_nX to pulse generating circuit 34_X based on synchronization signal Sync2, and pulse generating circuit 34_X is configured to provide switching control signal CTRLX to switching circuit 35_X based on set signal set_pX and set signal set_nX. In one embodiment, when multi-phase switching converter 300 starts up, phase control circuit 36 transits to phase control state BL_PHASE1 from initial state START; when detecting signal edge1 is effective to indicate that switching circuit 35_1 is turned ON, phase control circuit 36 transits to phase control state BL_PHASE2 from phase control state BL_PHASE1; when detecting signal edge2 is effective to indicate that switching circuit 35_2 is turned ON, phase control circuit 36 transits to a next phase control state from phase control state BL_PHASE2, and so on; and when phase control circuit 36 is in phase control state BL_PHASEX, if detecting signal edgeX is effective to indicate that switching circuit 35_X is turned ON, phase control circuit 36 transits to phase control state BL_PHASE1 from phase control state BL_PHASEX. Then the above process repeats.

Figure 7:
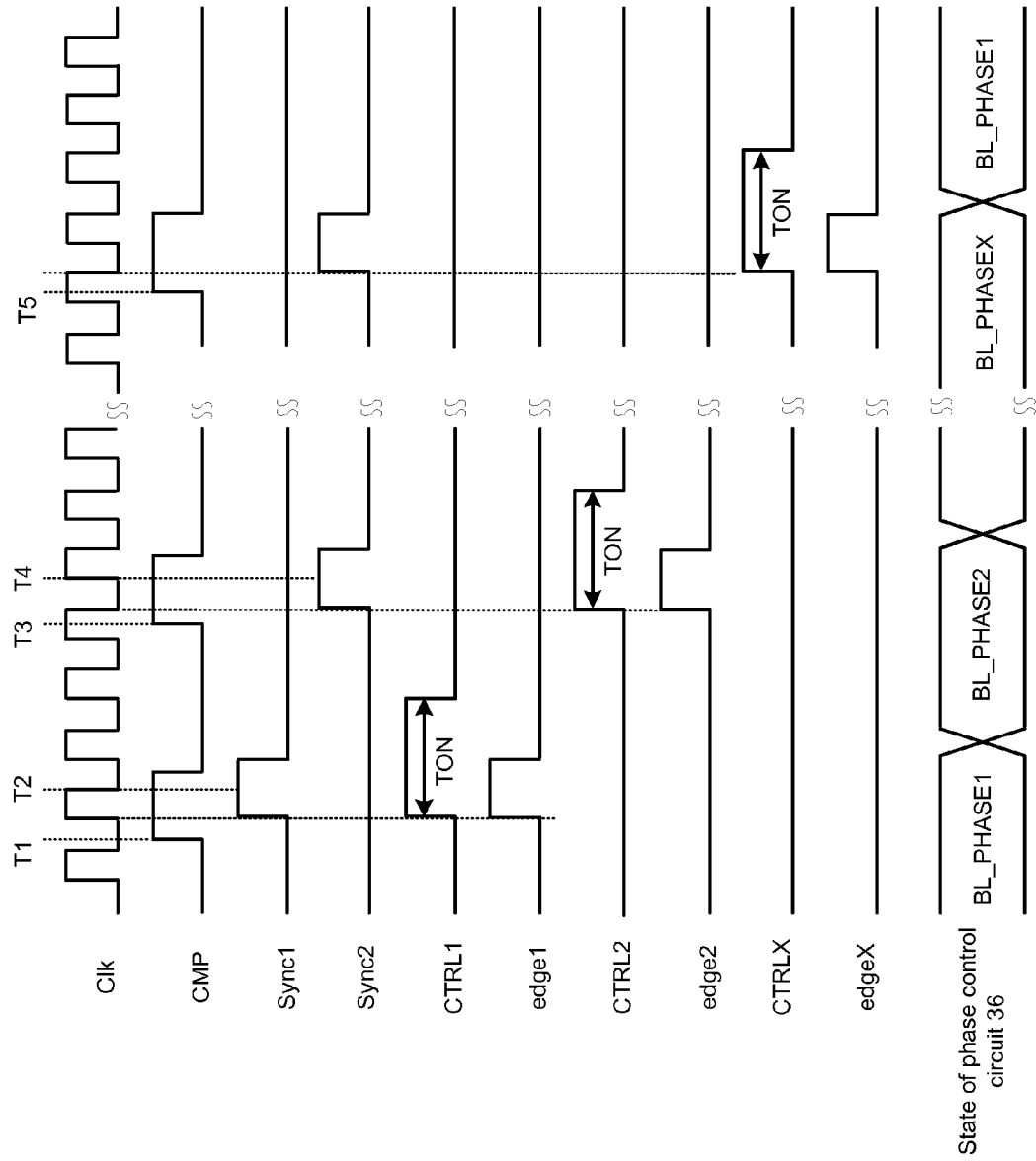
FIG. 7 shows waveforms of multi-phase switching converter 300 shown in FIG. 3 according to an embodiment of the present invention.

FIG. 7 shows waveforms of multi-phase switching converter 300 shown in FIG. 3 according to an embodiment of the present invention. At time T1, when feedback signal FB is less than reference signal Vref, comparison signal CMP becomes high voltage level. A following rising edge of clock signal Clk comes earlier than a following falling edge of clock signal Clk, Then synchronization signal Sync1 becomes high voltage level at the following rising edge of clock signal Clk, phase control circuit 36 is in phase control state BL_PHASE1, and phase control circuit 36 provides high voltage level set signal set_p1 based on synchronization signal Sync1, switching control signal CTRL1 becomes high voltage level to turn ON switching circuit 35_1. And then detecting signal edge1 becomes high voltage level, phase control circuit 35 transits to phase control state BL_PHASE2. Switching control signal CTRL1 becomes low voltage level to turn OFF switching circuit 35_1 until a predetermined ON-time period TON controlled by ON-time control signal COT expires. At time T2, which is the following falling edge of clock signal Clk after comparison signal CMP becomes high voltage level at time T1, synchronization signal Sync2 maintains low voltage level per synchronization signal Sync1 is high voltage level. At time T3, comparison signal CMP becomes high voltage level, a following falling edge of clock signal Clk comes first, synchronization signal Sync2 becomes high voltage level at the following falling edge of clock signal Clk, phase control circuit 36 is in phase control state BL_PHASE2, and phase control circuit 36 provides high voltage level set signal set_n2 based on synchronization signal Sync2, switching control signal CTRL2 becomes high voltage level to turn ON switching circuit 35_2. And then detecting signal edge2 becomes high voltage level, phase control circuit 35 transits to a next phase control state. At time T4, which is a following rising edge of clock signal Clk after comparison signal CMP becomes high voltage level at time T3, synchronization signal Sync1 maintains low voltage level per synchronization signal Sync2 is high voltage level. Switching control signal CTRL2 becomes low voltage level to turn OFF switching circuit 35_2 until predetermined ON-time period TON expires. At time T5, comparison signal CMP becomes high voltage level, synchronization signal Sync2 becomes high voltage level at a following falling edge of clock signal Clk, phase control circuit 36 is in phase control state BL_PHASEX, and phase control circuit 36 provides high voltage level set signal set_nX based on synchronization signal Sync2, switching control signal CTRLX becomes high voltage level to turn ON switching circuit 35_X. And then detecting signal edgeX becomes high voltage level, phase control circuit 35 transits to a next phase control state BL_PHASE1. Switching control signal CTRLX becomes low voltage level to turn OFF switching circuit 35_X until predetermined ON-time period TON expires.

Figure 8:
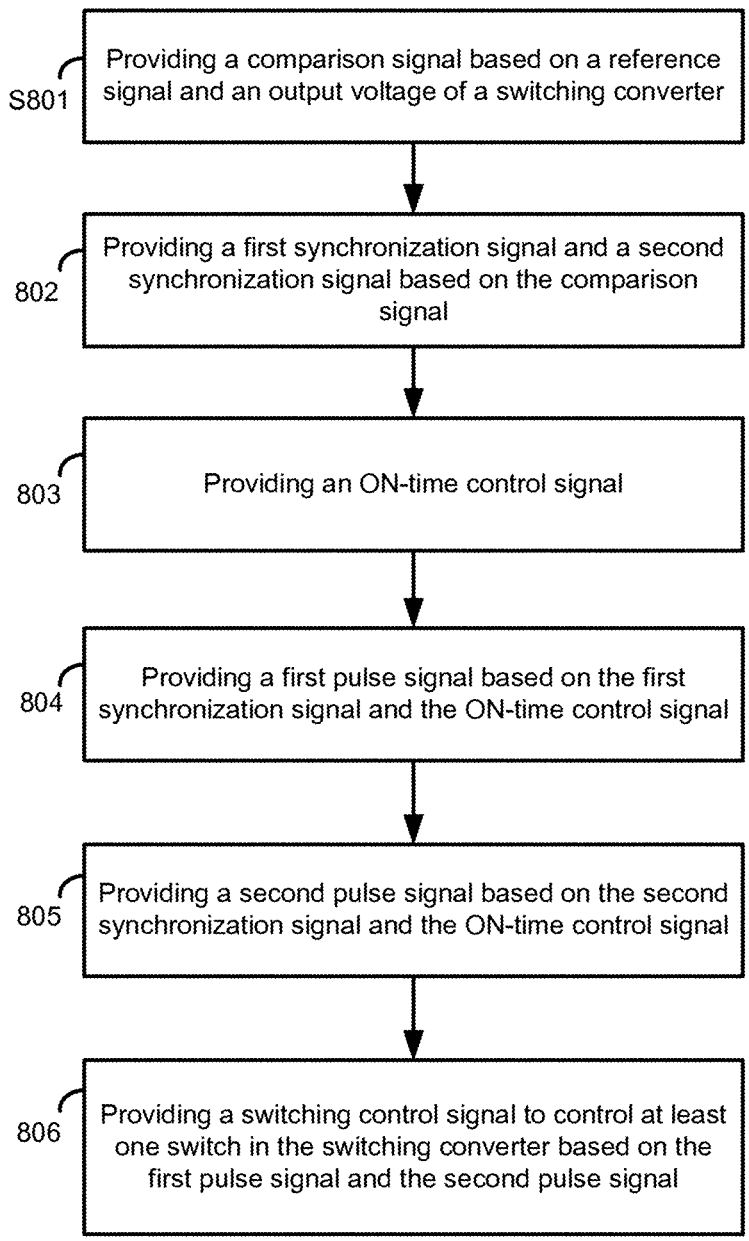
FIG. 8 shows a flow chart illustrating a control method for a switching converter according to an embodiment of the present invention.

FIG. 8 shows a flow chart illustrating a control method for a switching converter according to an embodiment of the present invention. The switching converter comprises at least one switch. The control method comprises steps 801-806.

In step 801, providing a comparison signal based on a reference signal and an output voltage of the switching converter.

In step 802, providing a first synchronization signal and a second synchronization signal based on the comparison signal.

In step 803, providing an ON-time control signal.

In step 804, providing a first pulse signal based on the first synchronization signal and the ON-time control signal.

In step 805, providing a second pulse signal based on the second synchronization signal and the ON-time control signal.

In step 806, providing a switching control signal to control the at least one switch in the switching converter based on the first pulse signal and the second pulse signal.

Figure 9:
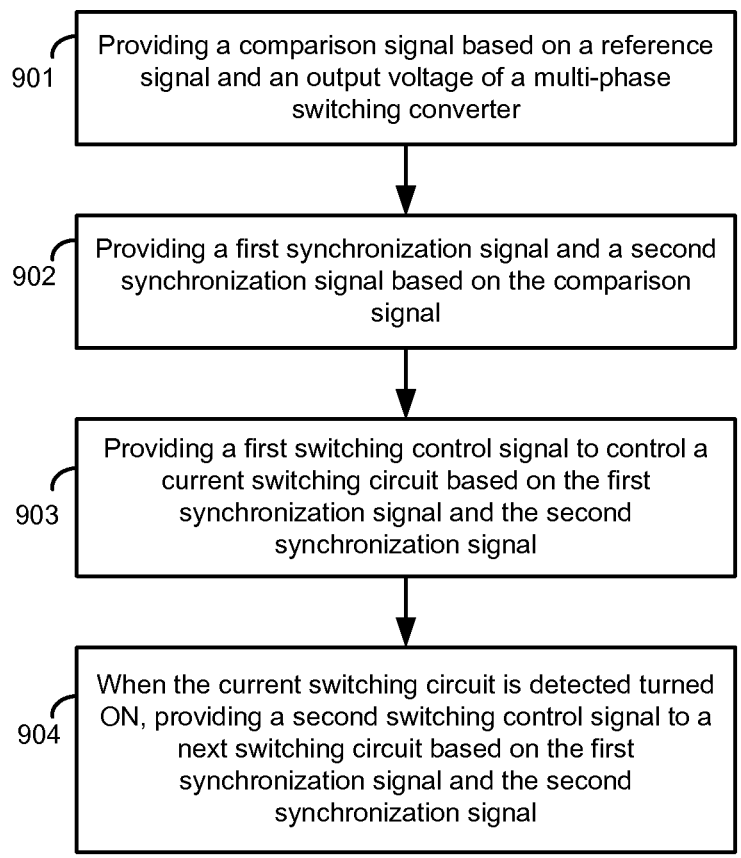
FIG. 9 shows a flow chart illustrating a control method for a multi-phase switching converter according to an embodiment of the present invention.

FIG. 9 shows a flow chart illustrating a control method for a multi-phase switching converter according to an embodiment of the present invention. The multi-phase switching converter comprises a plurality of switching circuits. The control method comprises steps 901-904.

In step 901, providing a comparison signal based on a reference signal and an output voltage of the switching converter.

In step 902, providing a first synchronization signal and a second synchronization signal based on the comparison signal.

In step 903, providing a first switching control signal to control a current switching circuit based on the first synchronization signal and the second synchronization signal.

In step 904, when the current switching circuit is detected turned ON, providing a second switching control signal to a next switching circuit based on the first synchronization signal and the second synchronization signal.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

We claim:

1. A control circuit for a switching converter, the switching converter having a switch and an output terminal configured to provide an output signal, and the control circuit comprising:
   a comparison circuit, configured to provide a comparison signal based on a reference signal and the output signal of the switching converter;
   a synchronization unit, configured to receive a first clock signal, a second clock signal and the comparison signal, and configured to provide a first synchronization signal and a second synchronization signal, wherein the first synchronization signal is generated by synchronizing the comparison signal with the first clock signal, and the second synchronization signal is generated by synchronizing the comparison signal with the second clock signal;
   an ON-time control circuit, configured to provide an ON-time control signal to control an ON-time period of the switch; and
   a logic unit, configured to receive the first synchronization signal, the second synchronization signal and the ON-time control signal, and configured to provide a switching control signal based on the first synchronization signal, the second synchronization signal and the ON-time control signal to control the switch, wherein the switch is turned ON based on the first synchronization signal and the second synchronization signal, and the switch is turned OFF based on the ON-time control signal.

2. The control circuit of claim 1, wherein the synchronization unit comprises:
   a first synchronization circuit, having a first input terminal, a second input terminal and an output terminal, wherein the first input terminal is configured to receive the first clock signal, the second input terminal is configured to receive the comparison signal, and the output terminal is configured to provide the first synchronization signal by synchronizing the comparison signal with a rising edge of the first clock signal; and
   a second synchronization circuit, having a first input terminal, a second input terminal and an output terminal, wherein the first input terminal is configured to receive the second clock signal, the second input terminal is configured to receive the comparison signal, and the output terminal is configured to provide the second synchronization signal by synchronizing the comparison signal with a rising edge of the second clock signal.

3. The control circuit of claim 2, wherein the first synchronization circuit comprises a D flip-flop, the D flip-flop having a data input terminal configured to receive the comparison signal, a clock terminal configured to receive the first clock signal, and an output terminal configured to provide the first synchronization signal.

4. The control circuit of claim 2, wherein the second synchronization circuit comprises a D flip-flop, the D flip-flop having a data input terminal configured to receive the comparison signal, a clock terminal configured to receive the second clock signal, and an output terminal configured to provide the second synchronization signal.

5. The control circuit of claim 1, wherein the synchronization unit comprises:
   a first shield circuit, having a first input terminal configured to receive the comparison signal, a second input terminal configured to receive the second synchronization signal, and an output terminal; and
   a first synchronization circuit, having a first input terminal coupled to the output terminal of the first shield circuit, a second input terminal configured to receive the first clock signal and an output terminal, wherein when the second synchronization signal is in a first state, the output terminal of the first synchronization circuit is configured to provide the first synchronization signal by synchronizing the comparison signal with the first clock signal, and when the second synchronization signal is in a second state, the first synchronization signal maintains.

6. The control circuit of claim 5, wherein the first shield circuit further comprises:
   a NOT gate, having an input terminal configured to receive the second synchronization signal, and an output terminal; and
   an AND gate, having a first input terminal coupled to the output terminal of the NOT gate, a second input terminal configured to receive the comparison signal, and an output terminal coupled to the first input terminal of the first synchronization circuit.

7. The control circuit of claim 1, wherein the synchronization unit further comprises:
   a second shield circuit, having a first input terminal configured to receive the comparison signal, a second input terminal configured to receive the first synchronization signal, and an output terminal; and
   a second synchronization circuit, having a first input terminal coupled to the output terminal of the second shield circuit, a second input terminal configured to receive the second clock signal and an output terminal, wherein when the first synchronization signal is in a first state, the output terminal of the second synchronization circuit is configured to provide the second synchronization signal by synchronizing the comparison signal with the second clock signal, and when the first synchronization signal is in a second state, the second synchronizing signal maintains.

8. The control circuit of claim 1, wherein the logic unit comprises:
   a first flip-flop circuit, configured to provide a first pulse signal based on the first synchronization signal, the first clock signal and the ON-time control signal, wherein the first flip-flop circuit is set by the first synchronization signal at a rising edge of the first clock signal, and the first flip-flop circuit is reset by the ON-time control signal;
   a second flip-flop circuit, configured to provide a second pulse signal based on the second synchronization signal, the second clock signal and the ON-time control signal, wherein the second flip-flop circuit is set by the second synchronization signal at a rising edge of the second clock signal, and the second flip-flop circuit is reset by the ON-time control signal; and
   an OR gate, configured to provide the switching control signal based on the first pulse signal and the second pulse signal.

9. A control circuit for a multi-phase switching converter, wherein the multi-phase switching converter having a plurality of switching circuits and an output terminal configured to provide an output signal, and the control circuit comprising:
- a comparison circuit, configured to provide a comparison signal based on a reference signal and the output signal of the multi-phase switching converter;
- a synchronization unit, configured to receive a clock signal and the comparison signal, and configured to provide a first synchronization signal and a second synchronization signal based on the clock signal and the comparison signal, wherein the first synchronization signal is generated by synchronizing the comparison signal with a rising edge of the clock signal, and the second synchronization signal is generated by synchronizing the comparison signal with a falling edge of the clock signal;
- an ON-time control circuit, configured to provide an ON-time control signal to control an ON-time period of each of the plurality of switching circuits; and
- a logic unit, configured to provide a plurality of switching control signals based on the first synchronization signal, the second synchronization signal and the ON-time control signal to control the plurality of switching circuits.

10. The control circuit of claim 9, wherein the logic unit further comprises:
- a plurality of detecting circuits, configured to provide a plurality of detecting signals, each detecting signal is generated based on corresponding switching control signal to indicate a status of corresponding switching circuit;
- a phase control circuit, configured to provide a group of first set signals and a group of second set signals based on the first synchronization signal, the second synchronization signal and the plurality of detecting signals, wherein when one of the plurality of detecting signals indicates that corresponding switching circuit is turned ON, the phase control circuit is configured to distribute the first synchronization signal as a first set signal to a next switching circuit, and the phase control circuit is configured to distribute the second synchronization signal as a second set signal to the next switching circuit; and
- a plurality of pulse generating circuits, each pulse generating circuit is coupled to the phase control circuit to receive corresponding first set signal, corresponding second set signal and the ON-time control signal, and each pulse generating circuit is configured to provide a switching control signal.

11. The control circuit of claim 10, wherein each pulse generating circuit further comprises:
- a first flip-flop circuit, having a set terminal, a reset terminal, a clock terminal and an output terminal, wherein the set terminal is configured to receive corresponding first set signal, the reset terminal is configured to receive the ON-time control signal, the clock terminal is configured to receive the clock signal, and the output terminal is configured to provide a first pulse signal based on corresponding first set signal, the clock signal and the ON-time control signal;
- a second flip-flop circuit, having a set terminal, a reset terminal, a clock terminal and an output terminal, wherein the set terminal is configured to receive corresponding second set signal, the reset terminal is configured to receive the ON-time control signal, the clock terminal is configured to receive the clock signal, and the output terminal is configured to provide a second pulse signal based on corresponding second set signal, the clock signal and the ON-time control signal; and
- a logic circuit, configured to provide the switching control signal based on the first pulse signal and the second pulse signal.

12. The control circuit of claim 9, wherein the synchronization circuit further comprises:
- a first synchronization circuit, having a first input terminal, a second input terminal and an output terminal, wherein the first input terminal is configured to receive the clock signal, and the output terminal is configured to provide the first synchronization signal based on the second synchronization signal, the clock signal and the comparison signal; and
- a second synchronization circuit, having a first input terminal, a second input terminal and an output terminal, wherein the first input terminal is configured to receive the clock signal, and the output terminal is configured to provide the second synchronization signal based on the first synchronization signal, the clock signal and the comparison signal.

13. The control circuit of claim 12, wherein the synchronization circuit further comprises:
- a first shield circuit, having a first input terminal, a second input terminal and an output terminal, wherein the first input terminal is coupled to the output terminal of the second synchronization circuit to receive the second synchronization signal, the second input terminal is configured to receive the comparison signal, and the output terminal is coupled to the second input terminal of the first synchronization circuit; wherein
when the second synchronization signal is in a second state, the first synchronization signal maintains.

14. The control circuit of claim 13, wherein the first shield circuit further comprises:
- a NOT gate, having an input terminal configured to receive the second synchronization signal, and an output terminal; and
- an AND gate, having a first input terminal coupled to the output terminal of the NOT gate, a second input terminal configured to receive the comparison signal, and an output terminal coupled to the second input terminal of the first synchronization circuit.

15. The control circuit of claim 12, wherein the synchronization circuit further comprises:
- a second shield circuit, having a first input terminal, a second input terminal and an output terminal, wherein the first input terminal is coupled to the output terminal of the first synchronization circuit to receive the first synchronization signal, the second input terminal is configured to receive the comparison signal, and the output terminal is coupled to the second input terminal of the second synchronization circuit; wherein
when the first synchronization signal is in a second state, the second synchronization signal maintains.

16. A method for controlling a multi-phase switching converter, wherein the multi-phase switching converter having a plurality of switching circuits and an output terminal configured to provide an output signal, and the method comprising:
- providing a comparison signal based on a reference signal and the output signal;
- providing a first synchronization signal based on the comparison signal and a first clock signal;
- providing a second synchronization signal based on the comparison signal and a second clock signal;

providing an ON-time control signal to control an ON-time period of each switching circuit; and providing a plurality of switching control signals based on the first synchronization signal, the second synchronization signal and the ON-time control signal to control the plurality of switching circuits; wherein when the second synchronization signal is in a first state, the first synchronization signal is generated by synchronizing the comparison signal with a first clock signal; and wherein when the first synchronization signal is in a first state, the second synchronization is generated by synchronizing the comparison signal with a second clock signal.

17. The method of claim 16, further comprising: when the second synchronization signal is in a second state, the first synchronization signal maintains.

18. The method of claim 16, further comprising: when the first synchronization signal is in a second state, the second synchronization signal maintains.

19. The method of claim 16, further comprising:

providing a group of first set signals based on the first synchronization signal;

providing a group of first pulse signals, each first pulse signal is generated based on corresponding first set signal, the first clock signal, and the ON-time control signal;

providing a group of second set signals based on the second synchronization signal;

providing a group of second pulse signals, each second pulse signal is generated based on corresponding second set signal, the second clock signal, and the ON-time control signal; and providing a switching control signal to control corresponding switching circuit based on corresponding first pulse signal and corresponding second pulse signal.

20. The method of claim 19, further comprising:

when one of the plurality of switching circuits is turned ON, distributing the first synchronizing signal as a first set signal to a next switching circuit, and distributing the second synchronization signal as a second set signal to the next switching circuit.

* * * * *